(12) United States Patent
Sutardja

(10) Patent No.: US 6,970,794 B2
(45) Date of Patent: Nov. 29, 2005

(54) SEMICONDUCTOR HAVING REDUCED CONFIGURATION PINS AND METHOD THEREOF

(75) Inventor: Sehat Sutardja, Los Altos Hills, CA (US)

(73) Assignee: Marvell International Ltd., Hamilton (BE)

(*) Notice: Subject to any disclaimer, the term of this patent is extended or adjusted under 35 U.S.C. 154(b) by 19 days.

(21) Appl. No.: 10/251,372

(22) Filed: Sep. 19, 2002

(65) Prior Publication Data

US 2004/0059528 A1 Mar. 25, 2004

(51) Int. Cl.[7] ............................................. G06F 19/00
(52) U.S. Cl. .................... 702/65; 702/105; 365/149; 365/194; 365/189.9
(58) Field of Search .................. 702/65, 105; 365/149, 365/194, 189.9; 324/73.1; 714/743

(56) References Cited

U.S. PATENT DOCUMENTS

| | | | | |
|---|---|---|---|---|
| 4,419,619 A | * | 12/1983 | Jindrick et al. ............. | 323/257 |
| 4,659,997 A | * | 4/1987 | Ferland et al. ............. | 330/257 |
| 4,764,925 A | * | 8/1988 | Grimes et al. ............. | 714/743 |
| 5,194,979 A | * | 3/1993 | Koai et al. .................. | 398/202 |
| 5,325,315 A | * | 6/1994 | Engel et al. ................ | 702/105 |
| 5,818,247 A | * | 10/1998 | Pyun ........................ | 324/756 |
| 6,101,618 A | * | 8/2000 | McClure ..................... | 714/27 |
| 6,400,160 B1 | * | 6/2002 | Sampath .................... | 324/613 |
| 6,643,472 B1 | * | 11/2003 | Sakamoto et al. ......... | 398/202 |
| 2002/0171448 A1 | * | 11/2002 | Takeuchi ................... | 324/765 |
| 2003/0210917 A1 | * | 11/2003 | Stewart et al. ............ | 398/209 |

* cited by examiner

Primary Examiner—Carol S. W. Tsai

(57) ABSTRACT

A configurable semiconductor device having a plurality of predetermined configurations comprises a measurement circuit to measure an electrical characteristic of at least one external impedance and to determine a digital value corresponding to the measured electrical characteristic. A storage circuit includes memory locations having contents accessible as a function of the digital value. Each of the contents corresponds to a respective one of the predetermined configurations. A controller configures a device characteristic of the configurable semiconductor device based on the contents of the memory locations corresponding to the digital value.

45 Claims, 7 Drawing Sheets

SEMICONDUCTOR HAVING REDUCED CONFIGURATION PINS AND METHOD THEREOF

TECHNICAL FIELD

An aspect of the invention relates to configuring semiconductors.

BACKGROUND

Broad classes of semiconductor devices may include several configurations of the same basic device differing in one or more aspects such as output voltage, frequency, trigger temperature, and the like. There are several conventional techniques for providing a specific configuration from a family of devices. In one technique, different versions of the same basic semiconductor are manufactured with slightly different internal component values or configuration to provide the differing outputs. For example, voltage regulators may include a family of devices having various output voltages and tolerance levels. Different devices are manufactured and inventoried by suppliers etc. to provide each of the possible combinations of output voltage and tolerance. An advantage of this approach is that devices with tight tolerances may be provided without the need for expensive external components. However, the cost of the regulators may be higher due to the lower quantities that are produced for each specific voltage/tolerance combination as well as the increased inventory costs.

Another technique uses one or more external components to complete an internal circuit such as an error amplifier for a voltage regulator. Here, the tolerance of the external components has a direct affect on the tolerance of the output that is generated. To attain an output with a tight tolerance, higher priced tight tolerance external components may be required. In addition, a large selection of the tight tolerance external components may be have to be stocked to provide flexibility in setting the output to the desired value.

Shown in FIG. 1A is a third technique for configuring a semiconductor 5. The third technique uses digital input signals to set the semiconductor configuration. Pull-up resistors 6 in combination with switches 7 generate the digital input signals. One digital input may select between two ($2^1$) configurations. Two digital inputs may select between four ($2^2$) configurations. Three digital inputs may select between eight ($2^3$) configurations and so on. To select between a moderate number of configurations, a large quantity of pins may be required. Dedicating four pins merely for selecting between 16 configurations is costly in terms of both, price and package size. Whereas, using two pins for selection may provide reasonable cost and package size, but only provides selection from amongst four configurations.

SUMMARY

A configurable semiconductor having a device characteristic that is controllable as a function of at least one external impedance. The configurable semiconductor including a measurement circuit to measure an electrical characteristic of the at least one external impedance and to determine a select value corresponding to the measured electrical characteristic. A first circuit to control the device characteristic as a function of the select value.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1A:
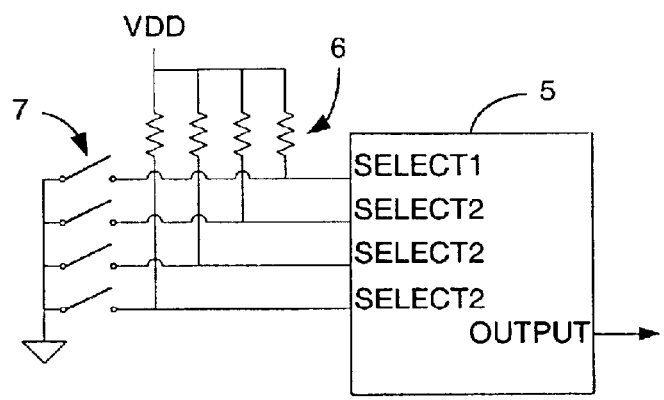
FIG. 1A is a block diagram of a selection circuit connected to a conventional configurable semiconductor.
Figure 1B:
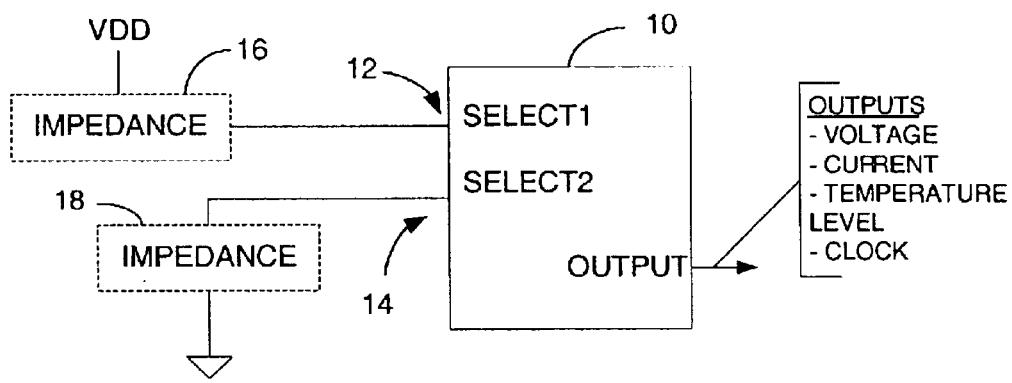
FIG. 1B is a block diagram of a configurable semiconductor connected to external impedances.

FIG. 1B shows a configurable semiconductor device 10 having, for example, two select pins 12 and 14 to connect to two external impedances 16 and 18. The configurable semiconductor device 10 advantageously uses a reduced number of select pins for interfacing to external components, as compared to conventional devices, to select one or more output and internal characteristics. One or more pins may be used to interface to the external component(s). The configurable semiconductor device probes or derives information from the external components connected to the select pins. The derived information has three or more predetermined level ranges that correspond to selected levels of the device characteristics. For example, a single pin connected to an external resistor may be used to select any one of 16 output voltage levels. The resistance of the external resistor is preferably selected to be one of 16 predetermined standard values. Each of the 16 values of resistance corresponds to one of the 16 output voltage levels. In addition, low precision passive components are preferably used as the external components to reduce cost and inventory. Each external component may have multiple, N, predetermined nominal values that each correspond to the selection of a predetermined characteristic level. If one pin is used, then N different characteristic levels may be selected. If two pins are used, then N*N different characteristic levels may be selected, and so forth for an increasing number of selection pins. The types of device characteristics that for example may be selected include output voltage, reference voltage, output current, reference current, clock frequency, temperature threshold, and tolerances of each of the device characteristics. For example, the configurable semiconductor device 10 may have a single select pin 12 connected to an external resistor that may have a nominal value selected from a group of 16 predetermined values. Each of the 16 predetermined values has a measured value range which corresponds to one of 16 predetermined output voltage levels possibly ranging from 3.3 volts to 15 volts. Examples of functional devices for which the configurable semiconductor device is particularly suitable include and are not limited to voltage regulators, current regulators, clock circuits, and temperature sensing circuits.

The external impedances 16 and 18 are preferably resistors, capacitors, or combinations of resistors and capacitors, but may be any component that exhibits predominantly an inductance, resistance, capacitance, or combination thereof. The external impedances 16 and 18 may be connected directly or indirectly from any energy source such as Vdd and ground or any suitable reference to the configurable semiconductor device pins 12 and 14. For example, the external impedance 16 may be connected through a resistor/transistor network to Vdd and through a capacitor network to the select pin 12.

The configurable semiconductor device 10 may determine a predetermined select value corresponding to the measured value of the impedance connected to a select pin. Preferably, the impedance is selected to have a standard value such as nominal resistance values corresponding to resistors having a 10% tolerance (e.g. 470, 560, 680, . . . ) to reduce device and inventory costs. To account for measurement tolerances and the tolerance of the external impedance, a range of impedance values may correspond to a single select value. The select value is preferably a digital value, but may also be an analog value. For example, values of measured resistance from 2400 ohms to 3000 ohms may be associated with a digital value corresponding to 2. While values of measured resistance from 3001 ohms to 4700 ohms are associated with a digital value corresponding to 3. The measured resistance includes variations due to tolerances of the external impedance and the internal measurement circuit. The impedance measured at each select pin is used to determine a corresponding digital value. The range of digital values may include 3 or more digital values and preferably range from 10 to 16 digital values per select pin. The digital values corresponding to each select pin may be used in combination to describe memory addresses. For example, a device having three select pins each to interface to impedance values that are mapped into one of 10 digital values, may describe 1000 memory addresses or lookup table values. The contents of the memory addresses are used to set a value for an output or internal characteristic of the device. Another exemplary device may include two select pins, each configured to interface to external impedances that are mapped to a digital value within a range of 10 values. The digital values in combination may describe 100 memory addresses or lookup table values that may each contain data for setting a characteristic of the configurable semiconductor device.

Figure 2:
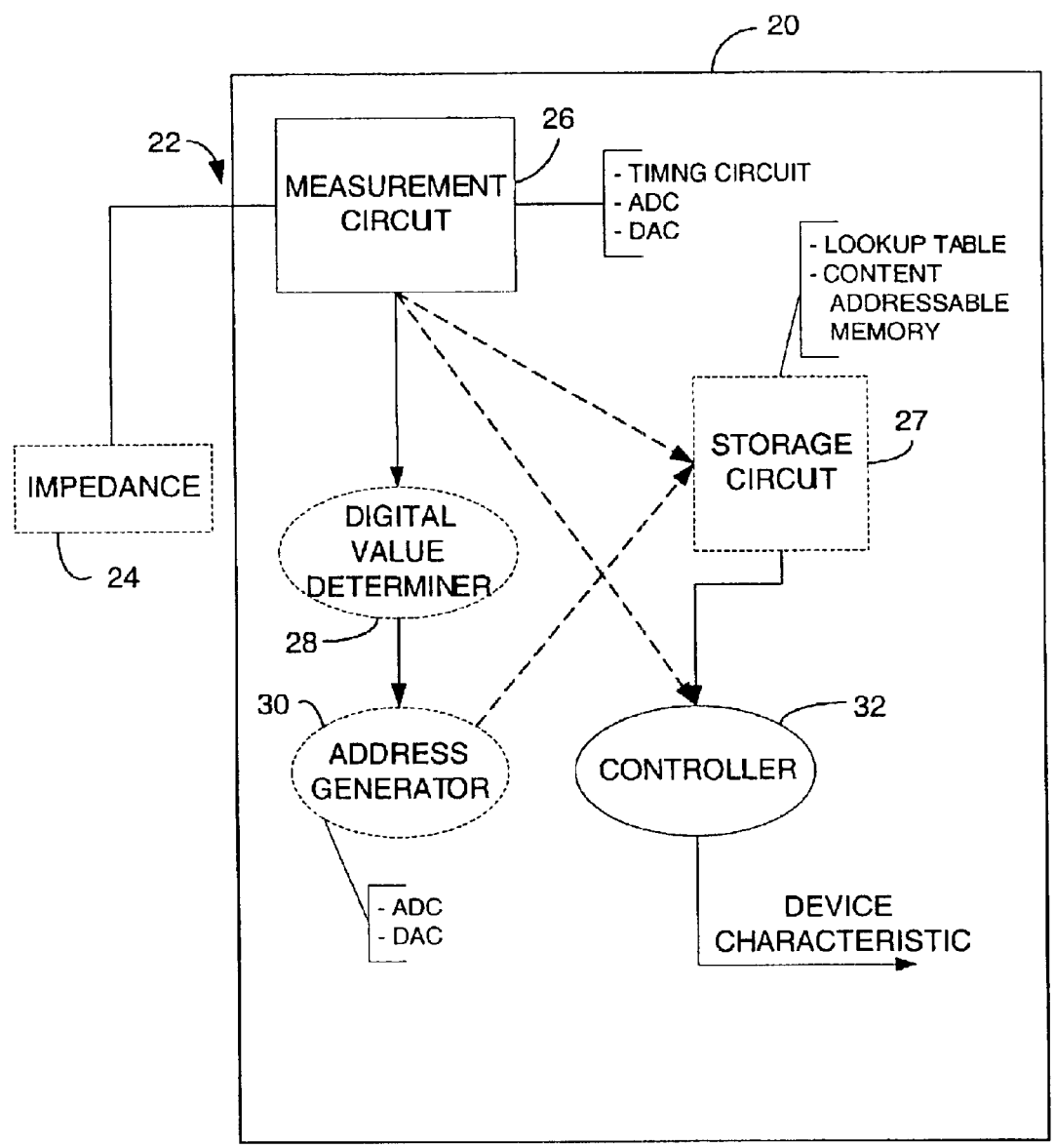
FIG. 2 is a detailed block diagram of a configurable semiconductor connected to external impedances.

FIG. 2 shows a block diagram of an aspect of a configurable semiconductor device 20. The configurable semiconductor device 20 includes a select pin 22 to interface to an external impedance 24 that is used for selecting a configuration of the configurable semiconductor device 20. The external impedance 24 is similar in function and scope to the external impedances 16 and 18.

A measurement circuit 26 connected to the select pin 22 measures an electrical characteristic that is a function of the external impedance 24. For example, a current may be supplied to the external impedance and the voltage that is developed across the external impedance 24 then measured. Also, a voltage may be impressed across the external impedance 24 and then measure the current. Any measurement technique for measuring passive components may be used to measure the electrical characteristic including dynamic as well as static techniques. Exemplary measurement techniques include timing circuits, analog to digital converters (ADCs), and digital to analog converters (DACs). Preferably, the measurement circuit has a high dynamic range. The measurement circuit 26 may generate an output having a value corresponding to the value of the external impedance 24. The output may be either digital or analog. The same output value preferably represents a range of external impedance values to compensate for value variations such as tolerances in the external impedance value, interconnect losses, and measurement circuit tolerances due to factors including process, temperature, and power. For example, all measured external impedance values ranging from greater than 22 up to 32 ohms may correlate to a digital output value of "0100". While measured external impedance values ranging from greater than 32 up to 54 ohms may correlate to a digital output value of "0101". The actual external impedance values are a subset of the measured external impedance value to account for the value variations. For example, in the above cases the actual external impedance values might be from 24 to 30 ohms and from 36 to 50 ohms. In each case an inexpensive low precision resistor may be selected to have a value centered within the range, such as 27 ohms and 43 ohms. In this way, inexpensive low precision components may be used to select amongst a range of high precision outputs. The select value may be used directly as a variable value to control a device characteristic of the configurable semiconductor 20. The variable value may also be determined indirectly from the select value.

A storage circuit 27 may include variable values that may be selected as a function of the select value. The storage circuit may be any type of storage structure including content addressable memory, static and dynamic memory, and look-up tables.

For the case that the measurement circuit 26 generates output values that have a one-to-one correspondence to the external impedance values, a digital value determiner 28 may then set the output value to a select value that corresponds to a range of external impedance values.

Figures 3A, 3B:
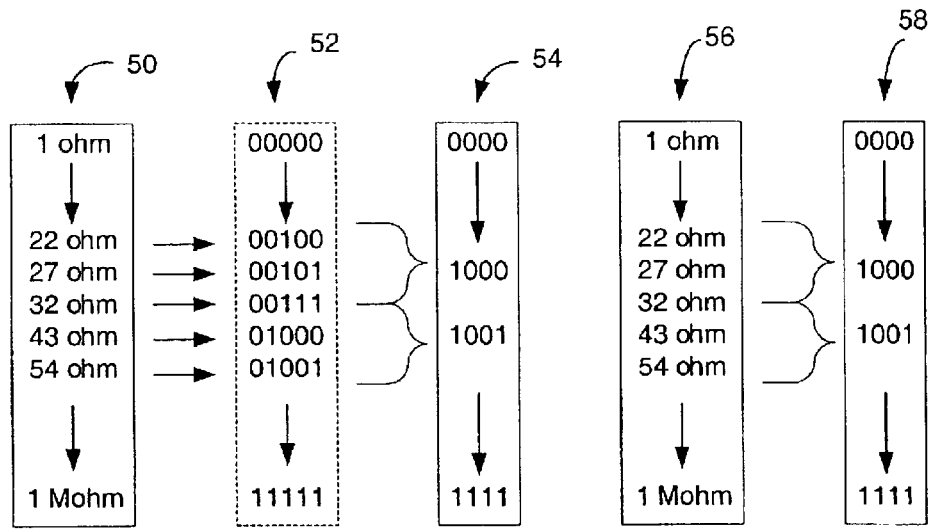
FIGS. 3A and 3B are diagrams showing relationships between an external impedance value and a digital value.

FIG. 3A shows a relationship between groups of impedance values 50 and associated select values 54. The groups of impedance values 50 may have a one-to-one correspondence to groups of digital output values 52 which are converted to the select values 54 associated with each of the groups of impedance values 50. The impedance values ranging from a minimum impedance value to a maximum impedance are separated in into three or more groups, with each group having a nominal impedance. The nominal impedance values of each of the groups may be selected to have a spacing between nominal impedance values. Here, the nominal values, 27 ohms and 43 ohms, of the groups of impedance values have a spacing of 16 ohms. The spacing between the groups of impedance values is preferably based on geometric progression, however any mathematical relationship may be used to establish spacing between the groups such as logarithmic, linear, and exponential. The spacing between impedance groups may be based on any impedance value of the groups including a nominal value, an average value, a mean value, a starting value, and an ending value. Factors that influence selection of the impedance range of the groups and the spacing may include various tolerances such as the tolerance of the external impedance, the tolerance of internal voltage and current sources, and the tolerance of the measurement circuit. The tolerances may for example be caused by process, temperature, and power variations.

FIG. 3B shows a relationship between ranges of impedance values 56 and associated select values 58. The ranges of impedance values 56 have a direct correspondence to the select values 58. The impedance values ranging from a minimum impedance value to a maximum impedance are separated in into three or more groups, with each group having a nominal impedance. The nominal impedance values of each of the groups may be selected to have a spacing between nominal impedance values. Here, the nominal values, 27 ohms and 43 ohms, of the groups of impedance values have a spacing of 16 ohms. This direct correspondence between the ranges of impedance values 56 and associated select values 58 may be implemented by, for example, a nonlinear analog to digital converter (not shown).

Referring back to FIG. 2, an address generator 30 may determine memory locations corresponding to the digital output values associated with external impedances connected to the select pins. The memory locations may be grouped in any manner such as a list for a single select pin, a lookup table for two select pins, and a third order table for three select pins.

A controller 32 sets a device characteristic of the configurable semiconductor device 20 as a function of the variable value. The variable value may be generated directly by the measurement circuit, determined indirectly from the select value, and determined from the contents of a memory location corresponding to the external impedance values connected to the select pins.

Figure 4:
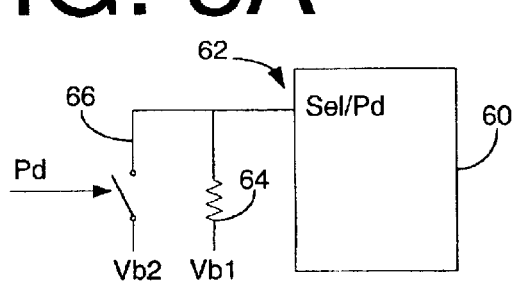
FIG. 4 is a schematic diagram of a configurable semiconductor having a multifunction pin.

FIG. 4 shows an aspect of another configurable semiconductor device 60. Configurable semiconductor device 60 is similar to configurable semiconductor device 20 in function, except that configurable semiconductor device 60 includes at least one multi-purpose select pin 62. The multi-purpose select pin 62 may be used for configuring the semiconductor device 60 as well as for an additional function such as power down (PD), power enable, mode selection, reset, and synchronous operation. The semiconductor device 60 may be configured in a manner similar to that of configurable semiconductor device 20.

In one aspect, a first range of impedance values connected to the multi-purpose select pin 62 may be used to configure the configurable semiconductor device 60, while operation of the additional function may be controlled by a voltage or current impressed on the multi-purpose select pin, or impedance values outside the first range of impedance values.

An external impedance 64 and a switch 66 may be connected to the multi-purpose select pin 62 to provide the selection function and the additional function respectively. Bias voltages, Vb1 and Vb2, may be applied to the external impedance 64 and transistor 66. The bias voltages, Vb1 and Vb2, may each be any value ranging from negative voltage through ground to positive voltage, and equal or not equal. The switch 66 may be connected in any manner including from the multi-purpose select pin 62 to ground, from the multi-purpose select pin 62 to a voltage source, from the multi-purpose select pin 62 to a current source, and from the multi-purpose select pin 62 through another impedance to an energy source. Any type of switch or device configured as a switch may be used including transistors, analog switches, jumper wires/traces, and manual switches.

Figure 5:
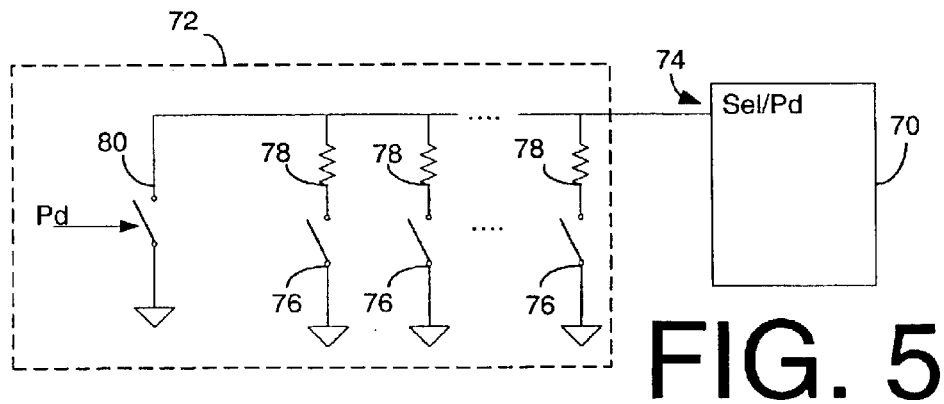
FIG. 5 is a schematic diagram of a multifunction pin with programmable control.

FIG. 5 shows a configurable semiconductor device 70 coupled to a digital control circuit 72. The digital control circuit 72 may be connected in any manner such as a stand-alone circuit and included in another device such as a processor. The configurable semiconductor device may include a multi-purpose select pin 74 similar in function to configurable semiconductor device 60. The digital control circuit 72 may include several switches 76 to control external impedances 78 for setting an impedance on the multi-purpose select pin 74. Any number and type of switches 76 may be employed including transistors, analog switches, jumper wires/traces, and manual switches. Preferably, the external impedances 78 are selected to have standard values although any range of values may be used. Another transistor 80 may control operation of additional functions.

Figure 6:
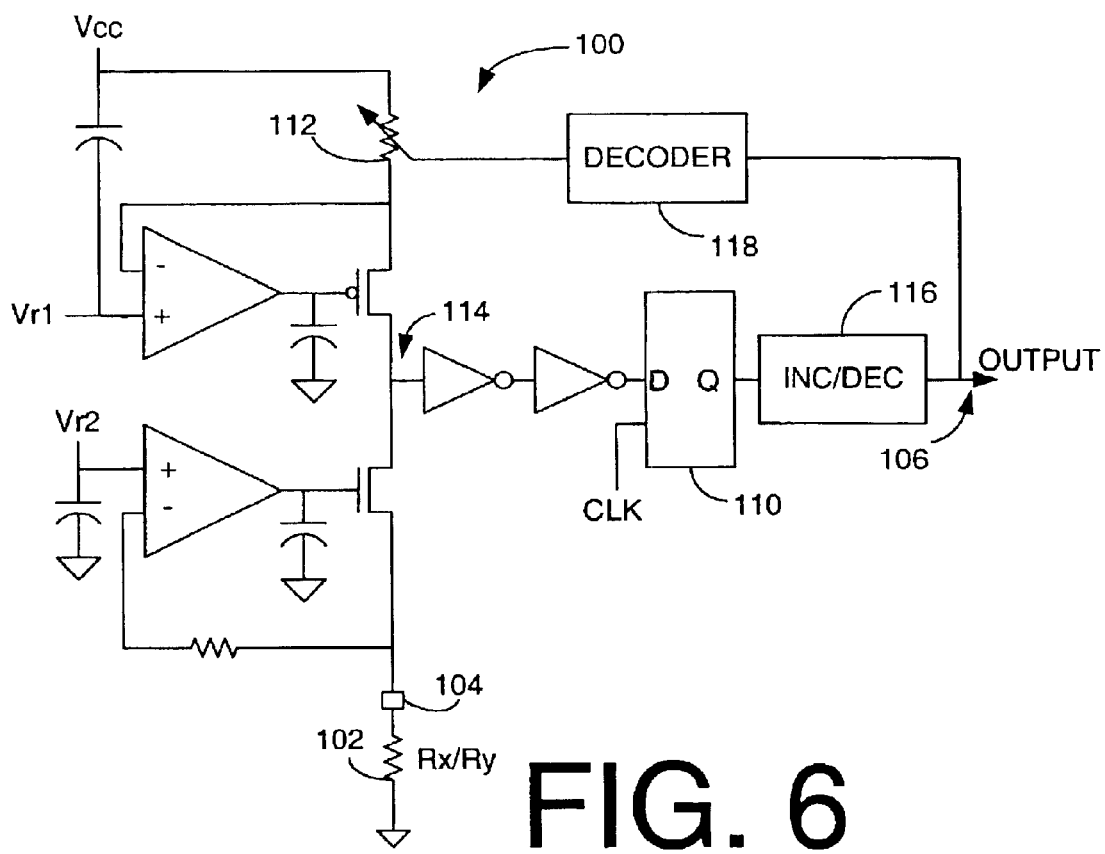
FIG. 6 is a schematic diagram of a timing circuit for generating a digital value.

FIG. 6 shows one embodiment of a measurement circuit 100 for determining a digital output 106 corresponding to an external impedance 102. The external impedance 102 may be connected to the measurement circuit 100 through a select pin 104. Table I shows exemplary values for the external impedance 102 and corresponding values of the digital output. Predefined operation #2 may enable the power down function. The impedance at the select pin that corresponds to predefined operations #1 or #2 may be intentional or unintentional such as a selected resistor, a cold solder joint, a broken trace, shorted traces, or a failed external device.

TABLE I

| # | Rx/Ry | Vout | Vout % | Digital Output |
|---|---|---|---|---|
| 0 | Short to Vss up to 10 k | 0 | 0 | Predefined operation #1 |
| 1 | 19.6 k | 0.8 | −2 | 000 |
| 2 | 28.5 k | 1.0 | −4 | 001 |
| 3 | 40 k | 1.2 | −6 | 010 |
| 4 | 56 k | 1.5 | −8 | 011 |
| 5 | 80.6 k | 1.8 | +2 | 100 |
| 6 | 113 k | 2.5 | +4 | 101 |
| 7 | 160 k | 3.0 | +6 | 110 |
| 8 | 226 k | 3.3 | +8 | 111 |
| 9 | 400 k to an open | | | Predefined operation #2 |

Figure 7:
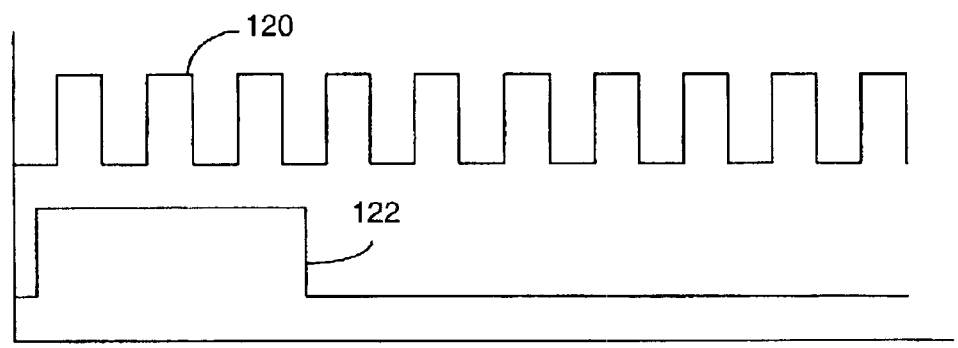
FIG. 7 shows waveforms associated with the timing circuit of FIG. 6.

FIG. 7 shows a timing diagram associated with the measurement circuit 100. A first waveform 120 represents a clock signal 120 to the D flip-flop 110. A second waveform 122 represents an input signal to the D input of the flip-flop 110. In operation, a controlled resistor 112 is initially set to a predetermined value. A first voltage is developed at a first node 114 as a function of the controlled resistor 112 and the external impedance 102. The first voltage is clocked through the flip-flop 110 by the clock signal 120. An incrementer/decrementer 116 may convert the output of the flip-flop 110 to the digital output 106. In response to the digital output 106, a decoder 118 adjusts the controlled resistor 112 to decrease the first voltage. The counter continues to increment until the first voltage decreases to a level equivalent to a logic "0".

Figure 8:
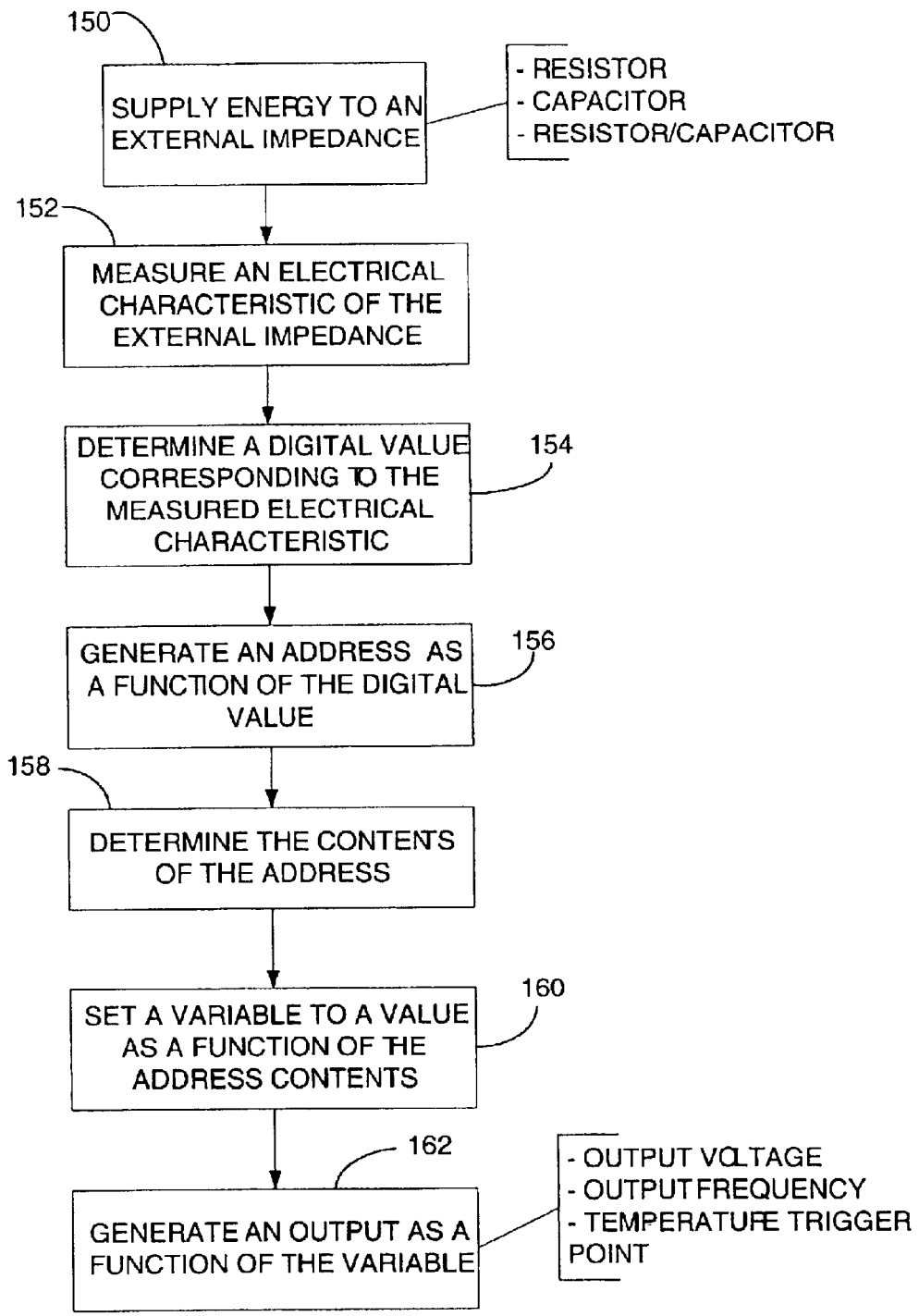
FIG. 8 is a flow diagram of an operation for configuring a semiconductor.

FIG. 8 shows an operation of a configurable semiconductor device. Starting at block 150, energy is supplied to an external impedance. Continuing to block 152, an electrical characteristic that is a function of the external impedance is measured. Electrical characteristics such as a voltage at the select pin and a current flowing through the select pin may be measured. At block 154, a select value corresponding to the measured electrical characteristic is determined. Continuing to block 156, an address may be generated as a function of the digital value. At block 158, the contents of the address are determined. At block 160, a variable may be controlled as a function of the select value such as directly and based on the address contents. At block 162, a device characteristic such as an output voltage may be controlled as a function of the variable.

Figure 9:
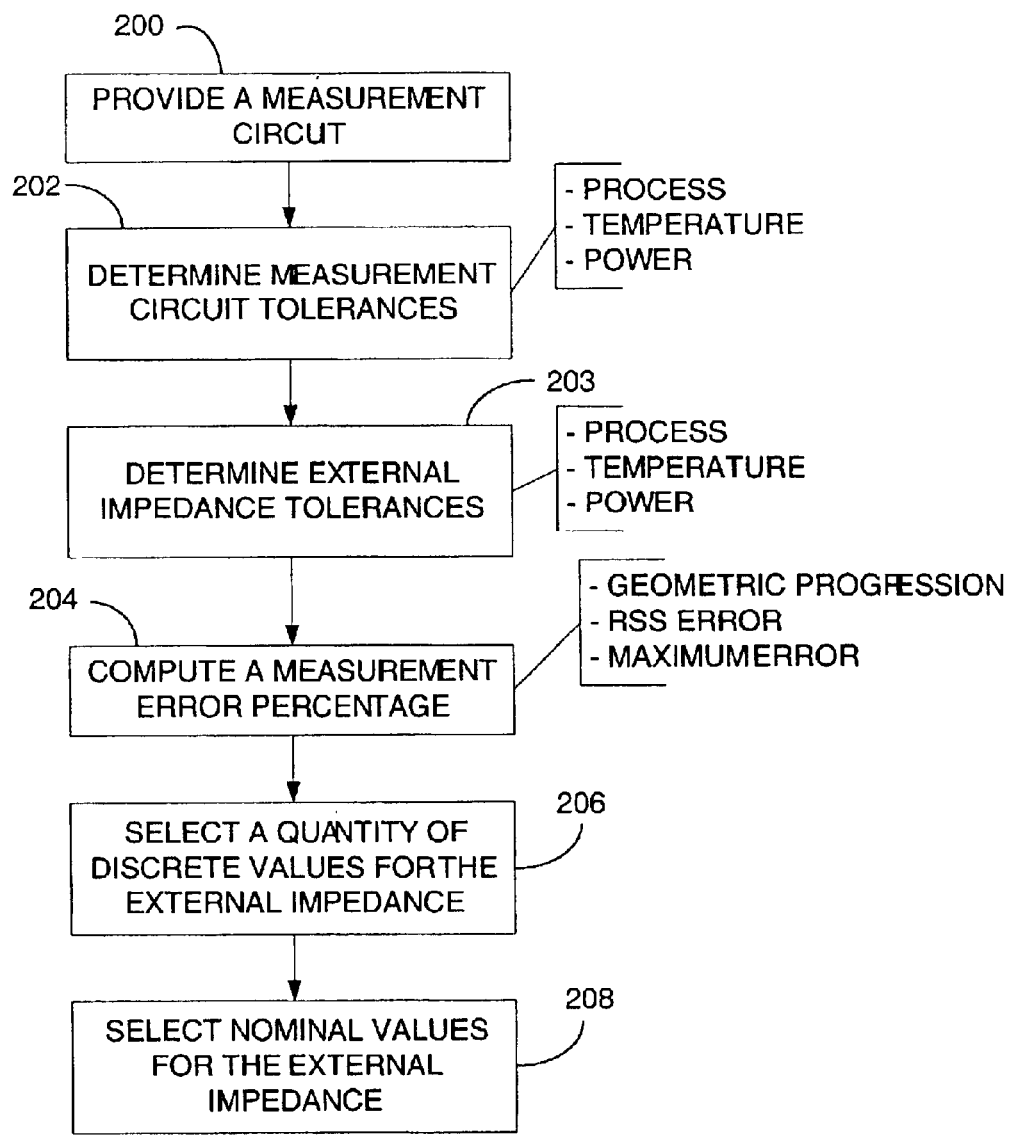
FIG. 9 is a flow diagram of an operation for selecting values for external impedances for configuring a semiconductor.

FIG. 9 shows an operation for selecting the spacing of external impedances used for configuring a semiconductor device. The spacing is preferably selected to permit the use of low precision components by varying the spacing from lower values to higher values to account for potential variations associated with the measurement circuit. Starting at block 200, a measurement circuit is provided. Continuing to blocks 202 and 203, tolerances associated with the measurement circuit and the external impedances may be determined. The tolerances may include variations due to process, temperature, and power. At block 204, a measurement error such as a geometric progression, a maximum error, and root of the sum of the squares (RSS) error may be computed. Continuing to block 206, a quantity of discrete values for the external impedance may be determined. For example, the measurement error may be applied across a voltage range of the measurement circuit to determine the maximum number of discrete values that may be selected. The quantity of discrete values may be any integer value greater than one. At block 208, nominal values are selected for the external impedance as a function of the computed error and the selected quantity of discrete values. The described operation is not limited to the described order of operation. Other ones of the variables may be solved for such as solving for the tolerance of the external impedance after selecting a desired quantity of discrete values.

Figure 10A:
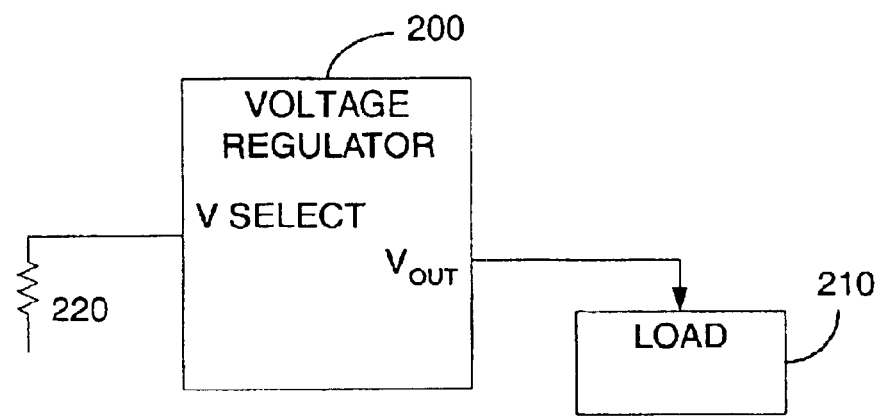
FIG. 10A is a block diagram of a voltage regulator connected to an external impedance.

FIG. 10A is an example of a voltage regulator in accordance with the present invention. Referring now to FIG. 10A a voltage regulator 200 is shown therein providing Vout to load 210, an external impedance 220 is used to select Vout. Table II shows exemplary values for the external impedance 220 and corresponding values of Vout. Predefined operation #2 may enable the power down function or low voltage to protect for an overvoltage condition presented to load 210. The impedance at the select pin that corresponds to predefined operations #1 or #2 may be intentional or unintentional such as a selected resistor, a cold solder joint, a broken trace, shorted traces, or a failed external device.

TABLE II

| # | Impedance 220 | Vout |
|---|---|---|
| 0 | Short to Vss up to 10 k | 0 or power down |
| 1 | 19.6 k | 0.8 |
| 2 | 28.5 k | 1.0 |
| 3 | 40 k | 1.2 |
| 4 | 56 k | 1.5 |
| 5 | 80.6 k | 1.8 |

TABLE II-continued

| # | Impedance 220 | Vout |
|---|---|---|
| 6 | 113 k | 2.5 |
| 7 | 160 k | 3.0 |
| 8 | 226 k | 3.3 |
| 9 | 400 k to an open | 0 or low voltage |

Figure 10B:
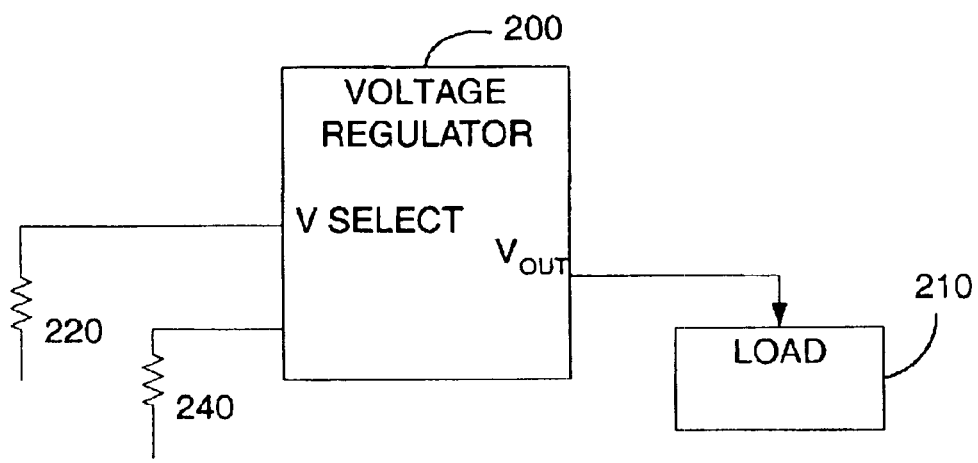
FIG. 10B is a block diagram of a voltage regulator connected to two external impedances.

FIG. 10B is an example of a voltage regulator in accordance with the present invention. Referring now to FIG. 10B a voltage regulator 200 is shown therein providing Vout to load 210, an external impedance 220 is used to select a nominal Vout and impedance 240 is used to select the offset from the nominal Vout. This provides for a significant number of additional output voltages. Table III shows exemplary values for the external impedance 220 and corresponding values of the offset percentages. If impedance 240 is a large value or perhaps an open circuit no offset will be applied to the nominal Vout. While if impedance 240 is a short or very low a predefined operation, such as discussed above, is implemented.

TABLE III

| # | Impedance 240 | Offset percentage |
|---|---|---|
| 0 | Short to Vss up to 10 k | Predefined operation |
| 1 | 19.6 k | −2 |
| 2 | 28.5 k | −4 |
| 3 | 40 k | −6 |
| 4 | 56 k | −8 |
| 5 | 80.6 k | +2 |
| 6 | 113 k | +4 |
| 7 | 160 k | +6 |
| 8 | 226 k | +8 |
| 9 | 400 k to an open | No Offset |

TABLE IV

| Imped 240 Offset % | Imped 220 | Nominal Vout | Short to Vss up to 10 k  0 | 19.6 k  −2 | 28.5 k  −4 | 40 k  −6 | 56 k  −8 | 80.6 k  +2 | 113 k  +4 | 160 k  +6 | 226 k  +8 | 400 k to an open |
|---|---|---|---|---|---|---|---|---|---|---|---|---|
| Short to Vss up to 10 k | 0 or power down | 0 or power down | 0 or power down | 0 or power down | 0 or power down | 0 or power down | 0 or power down | 0 or power down | 0 or power down | 0 or power down | 0 or power down | 0 or power down |
| 19.6 k | 0.8 | 0.8 | * | 0.784 | 0.768 | 0.752 | 0.736 | 0.816 | 0.832 | 0.848 | .0864 | 0.8 |
| 28.5 k | 1.0 | 1.0 | * | 0.980 | 0.960 | 0.940 | 0.920 | 1.020 | 1.040 | 1.060 | 1.080 | 1.0 |
| 40 k | 1.2 | 1.2 | * | 1.176 | 1.152 | 1.128 | 1.104 | 1.224 | 1.248 | 1.272 | 1.296 | 1.2 |
| 56 k | 1.5 | 1.5 | * | 1.470 | 1.440 | 1.410 | 1.380 | 1.530 | 1.560 | 1.590 | 1.620 | 1.5 |
| 80.6 k | 1.8 | 1.8 | * | 1.764 | 1.728 | 1.692 | 1.656 | 1.836 | 1.872 | 1.908 | 1.944 | 1.8 |
| 113 k | 2.5 | 2.5 | * | 2.450 | 2.400 | 2.350 | 2.300 | 2.550 | 2.600 | 2.650 | 2.700 | 2.5 |
| 160 k | 3.0 | 3.0 | * | 2.940 | 2.880 | 2.820 | 2.760 | 3.060 | 3.120 | 3.180 | 3.240 | 3.0 |
| 226 k | 3.3 | 3.3 | * | 3.234 | 3.168 | 3.102 | 3.036 | 3.366 | 3.432 | 3.498 | 3.564 | 3.3 |
| 400 k to an open | 0 or low voltage | 0 or low voltage | 0 or low voltage | 0 or low voltage | 0 or low voltage | 0 or low voltage | 0 or low voltage | 0 or low voltage | 0 or low voltage | 0 or low voltage | 0 or low voltage | 0 or low voltage |

*predefined operation

Table IV above is an example of the nominal Vout and the offset percentage selected in accordance with external impedances. For example if impedance 220 is nominally 160 k ohms the nominal Vout is 3.0 volts and if impedance 240 is 28.5 k the offset from the nominal Vout is −4%. This results in a Vout of the voltage regulator of 3.168 volts.

A number of embodiments of the invention have been described. Nevertheless, it will be understood that various modifications may be made without departing from the spirit and scope of the invention. Accordingly, other embodiments are within the scope of the following claims.

What is claimed is:

1. A configurable semiconductor device having a plurality of predetermined configurations, comprising:
    a measurement circuit to measure an electrical characteristic of at least one external impedance and to determine a digital value corresponding to the measured electrical characteristic;
    a storage circuit including memory locations having contents accessible as a function of the digital value, wherein each of the contents corresponds to a respective one of the predetermined configurations; and
    a controller to configure a device characteristic of the configurable semiconductor device based on the contents of the memory locations corresponding to the digital value.

2. The configurable semiconductor of claim 1 further comprising a generator to supply energy to the external impedance.

3. The configurable semiconductor of claim 1 wherein the storage circuit includes memory devices selected from a group consisting of content addressable memory, static memory, dynamic memory, and look-up tables.

4. The configurable semiconductor of claim 1 wherein the measurement circuit is selected from a group consisting of timing circuits, Digital to Analog Converters, and Analog to Digital Converters.

5. The configurable semiconductor of claim 1 further comprising a value determiner to determine the digital value corresponding to the measured electrical characteristic; and
    an address generator to convert the digital value to a first digital address corresponding to one of the memory locations.

6. The configurable semiconductor of claim 1 wherein the at least one external impedance is selected from a group consisting of a resistor, a capacitor, and combinations thereof.

7. The configurable semiconductor of claim 1 wherein the at least one external impedance has a value;
    the electrical characteristic is selected from a group consisting of voltage and current; and
    the electrical characteristic is a function of the value.

8. The configurable semiconductor of claim 7 wherein the at least one external impedance value is selected from a predetermined group of values comprising at least three values.

9. The configurable semiconductor of claim 8 wherein the group of values has a spacing characteristic selected from a group consisting of exponential, linear, and logarithmic.

10. The configurable semiconductor of claim 8 wherein the at least three values are each nominal values; and
    wherein the at least three nominal values are spaced apart based on tolerances associated with at least the measurement circuit.

11. The configurable semiconductor of claim 1 being adapted to connect to at least two external impedances;
    a first one of the at least two external impedances to be used to select an electrical characteristic of the configurable semiconductor; and
    a second one of the at least two external impedances to be used to select a tolerance associated with the configurable semiconductor electrical characteristic.

12. The configurable semiconductor of claim 11 wherein the configurable semiconductor electrical characteristic is selected from a group consisting of output voltage, reference voltage, output current, reference current, output frequency, reference frequency, and temperature level.

13. The configurable semiconductor of claim 1 further comprising a package having pins, to enclose the configurable semiconductor; and
    the at least one external impedance to interface to the configurable semiconductor through the package pins.

14. The configurable semiconductor of claim 13 further including another circuit to provide a circuit function;
    each external impedance corresponding to one of the package pins; and
    at least one package pin corresponding to one external impedance to connect to the other circuit, the at least one package pin to provide at least a selection function and a circuit function.

15. The configurable semiconductor of claim 14 wherein the circuit function of the other circuit includes an additional operation such that the at least one package pin provides at least a selection function and an additional operation function.

16. The configurable semiconductor of claim 1 included in a functional device selected from a group consisting of a voltage regulator, a current regulator, a clock circuit, and a temperature sensing circuit.

17. A method of operating a configurable semiconductor device having a plurality of predetermined configurations, comprising:
    measuring an electrical characteristic of at least one external impedance;
    determining a digital value corresponding to the measured electrical characteristic;
    accessing contents in memory locations as a function of the digital value, wherein each of the contents corresponds to a respective one of the predetermined configurations; and
    configuring a device characteristic of the configurable semiconductor device based on the contents of the memory locations corresponding to the digital value.

18. The method of claim 17 further comprising supplying energy to the external impedance.

19. The method of claim 17 further comprising converting the digital value to a first digital address corresponding to a memory location having contents; and
    setting the device characteristic as a function of the contents of the memory location corresponding to the first digital address.

20. The method of claim 17 wherein the at least one external impedance is selected from a group consisting of a resistor, a capacitor, and combinations thereof.

21. The method of claim 17 wherein the at least one external impedance has a value;
    the electrical characteristic is selected from a group consisting of voltage and current; and
    the electrical characteristic is a function of the value.

22. The method of claim 17 wherein the at least one external impedance value is selected from a predetermined group of values comprising at least three values.

23. The method of claim 17 wherein the group of values has a spacing characteristic selected from a group consisting of exponential, linear, and logarithmic.

24. The method of claim 23 wherein the at least three values are each nominal values and further comprising:

spacing apart the at least three nominal values based on tolerances associated with measuring the electrical characteristic of the at least one external impedance.

25. The method of claim 17 further comprising using a first one of at least two external impedances to select an electrical characteristic of the configurable semiconductor; and using a second one of the at least two external impedances to select a tolerance associated with the configurable semiconductor electrical characteristic.

26. The method of claim 17 wherein the electrical characteristic is selected from a group consisting of output voltage, reference voltage, output current, reference current, output frequency, reference frequency, and temperature level.

27. The method of claim 17 further comprising enclosing the configurable semiconductor within a package having pins; and interfacing the at least one external impedance to the configurable semiconductor through the package pins.

28. The method of claim 27 further comprising providing another circuit having a circuit function;

associating each external impedance to one of the package pins such that there is a one-to-one correspondence; and at least one package pin corresponding to one external impedance to connect to the other circuit of the configurable semiconductor, the at least one package pin to provide at least a selection function and a circuit function.

29. The method of claim 28 wherein the circuit function of the other circuit includes an additional operation such that the at least one package pin provides at least a selection function and an additional operation function.

30. The method of claim 17 further comprising generating a device output selected from the group consisting of a regulated output voltage, a regulated output current, a clock signal, and a temperature sense signal.

31. A configurable semiconductor device having a plurality of predetermined configurations, comprising:

measurement means for measuring an electrical characteristic of at least one external impedance and for determining a digital value corresponding to the measured electrical characteristic;

storing means including memory locations having contents accessible as a function of the digital value, wherein each of the contents corresponds to a respective one of the predetermined configurations; and control means for configuring a device characteristic of the configurable semiconductor device based on the contents of the memory locations corresponding to the digital value.

32. The configurable semiconductor of claim 31 further comprising means for supplying energy to the external impedance.

33. The configurable semiconductor of claim 31 further comprising means for determining a digital value corresponding to the measured electrical characteristic; and means for converting the digital value to a first digital address corresponding to a memory location having contents.

34. The configurable semiconductor of claim 31 wherein the means for measuring is selected from a group consisting of timing circuits, Digital to Analog Converters, and Analog to Digital Converters.

35. The configurable semiconductor of claim 31 wherein the at least one external impedance is selected from a group consisting of a resistor, a capacitor, and combinations thereof.

36. The configurable semiconductor of claim 31 wherein the at least one external impedance has a value;

the electrical characteristic is selected from a group consisting of voltage and current; and the electrical characteristic is a function of the value.

37. The configurable semiconductor of claim 36 wherein the at least one external impedance value is selected from a predetermined group of values comprising at least three values.

38. The configurable semiconductor of claim 37 wherein the group of values has a spacing characteristic selected from a group consisting of exponential, linear, and logarithmic.

39. The configurable semiconductor of claim 37 wherein the at least three values are each nominal values; and wherein the at least three nominal values are spaced apart based on tolerances associated with at least the measurement circuit.

40. The configurable semiconductor of claim 31 being adapted to connect to at least two external impedances;

a first one of the at least two external impedances to be used to select an electrical characteristic of the configurable semiconductor; and a second one of the at least two external impedances to be used to select a tolerance associated with the configurable semiconductor electrical characteristic.

41. The configurable semiconductor of claim 40 wherein the configurable semiconductor electrical characteristic is selected from a group consisting of output voltage, reference voltage, output current, reference current, output frequency, reference frequency, and temperature level.

42. The configurable semiconductor of claim 31 further comprising means for enclosing the configurable semiconductor, the enclosing means having pins; and the at least one external impedance to interface to the configurable semiconductor through the enclosing means pins.

43. The configurable semiconductor of claim 42 further including another circuit to provide a circuit function;

each external impedance corresponding to one of the enclosing means pins; and at least one enclosing means pin corresponding to one external impedance to connect to the other circuit, the at least one enclosing means pin to provide at least a selection function and a circuit function.

44. The configurable semiconductor of claim 43 wherein the circuit function of the other circuit includes an additional operation such that the at least one enclosing means pin provides at least a selection function and an additional operation function.

45. The configurable semiconductor of claim 31 included in a functional device selected from a group consisting of a voltage regulator, a current regulator, a clock circuit, and a temperature sensing circuit.

* * * * *

UNITED STATES PATENT AND TRADEMARK OFFICE
CERTIFICATE OF CORRECTION

PATENT NO.       : 6,970,794 B2
APPLICATION NO.  : 10/251372
DATED            : November 29, 2005
INVENTOR(S)      : Sehat Sutardja It is certified that error appears in the above-identified patent and that said Letters Patent is hereby corrected as shown below:

Column 1, Line 38:    Delete "be " after "may"
Column 4, Line 45:    Delete "in" after "separated"
Column 5, Line 2:     Delete "in" after "separated"

Signed and Sealed this

Twelfth Day of September, 2006

JON W. DUDAS
*Director of the United States Patent and Trademark Office*